(12) United States Patent
Grafendorfer et al.

(10) Patent No.: US 8,791,696 B2
(45) Date of Patent: Jul. 29, 2014

(54) SYSTEM AND METHOD PROVIDING PREAMPLIFIER FEEDBACK FOR MAGNETIC RESONANCE IMAGING

(75) Inventors: Thomas Grafendorfer, Meno Park, CA (US); Paul David Calderon, Castro Valley, CA (US); Fraser Robb, Aurora, OH (US); James S. Tropp, Berkeley, CA (US); Greig Cameron Scott, Palo Alto, CA (US); Shreyas Vasanawala, Stanford, CA (US)

(73) Assignee: General Electric Company, Schenectady, NY (US)

( * ) Notice: Subject to any disclaimer, the term of this patent is extended or adjusted under 35 U.S.C. 154(b) by 598 days.

(21) Appl. No.: 12/757,782

(22) Filed: Apr. 9, 2010

(65) Prior Publication Data

US 2011/0248712 A1 Oct. 13, 2011

(51) Int. Cl.
*G01V 3/00* (2006.01)
(52) U.S. Cl.
USPC ........................................... 324/307
(58) Field of Classification Search
USPC ........... 324/300–322; 330/109, 282, 293, 294
See application file for complete search history.

(56) References Cited

U.S. PATENT DOCUMENTS

| | | | |
|---|---|---|---|
| 5,389,778 A * | 2/1995 | Shinomiya | 250/214 R |
| 5,396,189 A * | 3/1995 | Hays | 330/149 |
| 6,159,444 A | 12/2000 | Schlenga et al. | |
| 6,246,896 B1 | 6/2001 | Dumoulin et al. | |
| 6,459,265 B1 * | 10/2002 | Lou et al. | 324/322 |
| 6,741,483 B1 | 5/2004 | Stanley | |
| 7,268,548 B2 | 9/2007 | Sellers | |
| 7,378,851 B1 | 5/2008 | de Rooij et al. | |
| 7,633,293 B2 | 12/2009 | Olson et al. | |
| 7,639,015 B2 | 12/2009 | Thuringer et al. | |
| 2003/0184294 A1 * | 10/2003 | Boskamp et al. | 324/318 |
| 2005/0154291 A1 | 7/2005 | Zhao et al. | |
| 2006/0058619 A1 | 3/2006 | DeYoe et al. | |
| 2008/0088305 A1 | 4/2008 | Olson et al. | |
| 2009/0102484 A1 * | 4/2009 | DeVries et al. | 324/322 |
| 2009/0304149 A1 | 12/2009 | Herrmann et al. | |

OTHER PUBLICATIONS

De Zanche, Principles of Array System Design, ISMRM 14th Scientific Meeting and Exhibition, Seattle, Washington, USA, May 6-12, 2006.*

* cited by examiner

*Primary Examiner* — Melissa Koval
*Assistant Examiner* — Daniel Miller
(74) *Attorney, Agent, or Firm* — The Small Patent Law Group; Dean D. Small

(57) ABSTRACT

A system and method for generating preamplifier feedback in magnetic resonance imaging (MRI) systems are provided. A preamplifier arrangement for the MRI system includes a plurality of preamplifiers with each of the preamplifiers connected to a different channel of a multi-channel coil array of the MRI system. The preamplifier arrangement further includes a feedback network connected to each of the plurality of preamplifiers with each of the feedback networks configured to generate negative feedback at one or more oscillation frequencies.

16 Claims, 5 Drawing Sheets

SYSTEM AND METHOD PROVIDING PREAMPLIFIER FEEDBACK FOR MAGNETIC RESONANCE IMAGING

STATEMENT REGARDING FEDERALLY SPONSORED RESEARCH & DEVELOPMENT

This invention was made with Government support under contract EB009690 awarded by the National Institutes of Health. The Government has certain rights in this invention.

BACKGROUND OF THE INVENTION

The subject matter disclosed herein relates generally to magnetic resonance imaging (MRI) systems, and more particularly to systems and methods for reducing preamplifier oscillation in MRI systems.

Magnetic Resonance Imaging (MRI) systems include a magnet, such as a superconducting magnet that generates a temporally constant (i.e., uniform and static) primary or main magnetic field. MRI data acquisition is accomplished by exciting magnetic moments within the primary magnetic field using magnetic gradient coils. For example, in order to image a region of interest, the magnetic gradient coils are energized to impose a magnetic gradient to the primary magnetic field. Transmit radio-frequency (RF) coils are then pulsed to create RF magnetic field pulses in a bore of an MRI scanner to selectively excite a volume corresponding to the region of interest in order to acquire MR images of the region of interest using receive RF coils. During the transmission of the RF magnetic field pulses, the receive RF coils are decoupled or disabled and during reception the transmit RF coils are decoupled or disabled. The resultant image that is generated shows the structure and function of the region of interest.

Preamplifiers in MRI systems, which are used to amplify the received MR signals, are increasingly placed closer to the imaging coils, such as on-coil preamplifiers. These on-coil preamplifiers increase the preamplifier-decoupling performance in multi-channel coil arrays, which results in an improved signal to noise ratio (SNR) and improved acceleration performance. However, placing the preamplifiers in the vicinity of the coil elements opens a new feedback path that can easily cause oscillation, resulting in degraded imaging performance of the MRI system.

Conventional systems attempt to reduce the preamplifier feedback using devices to reduce the feedback from the preamplifier into the coil array, such as input baluns, output baluns, additional shielding, additional isolation, etc. These devices can add cost and complexity to the system. Additionally, preamplifier-decoupling performance is adversely affected, for example, as a result of increased preamplifier input impedance from input baluns.

BRIEF DESCRIPTION OF THE INVENTION

In accordance with various embodiments, a preamplifier arrangement for a magnetic resonance imaging (MRI) system is provided that includes a plurality of preamplifiers with each of the preamplifiers connected to a different channel of a multi-channel coil array of the MRI system. The preamplifier arrangement further includes a feedback network connected to each of the plurality of preamplifier with each of the feedback networks configured to generate negative feedback at one or more oscillation frequencies.

In accordance with other embodiments, a receive section for a magnetic resonance imaging (MRI) system is provided that includes a plurality of channels connected to a receive coil array and a preamplifier connected to each of the channels. The receive section further includes a feedback network connected to each of the preamplifiers, wherein the feedback networks each include a parallel resonator configured to provide selective negative feedback to the preamplifiers.

In accordance with yet other embodiments, a method for suppressing oscillation in a multi-channel coil array of a magnetic resonance imaging (MRI) system is provided. The method includes generating frequency selective negative feedback with a parallel oscillator and applying the negative feedback to a preamplifier of the MRI system to suppress preamplifier oscillation.

DETAILED DESCRIPTION OF THE INVENTION

Figure 1:
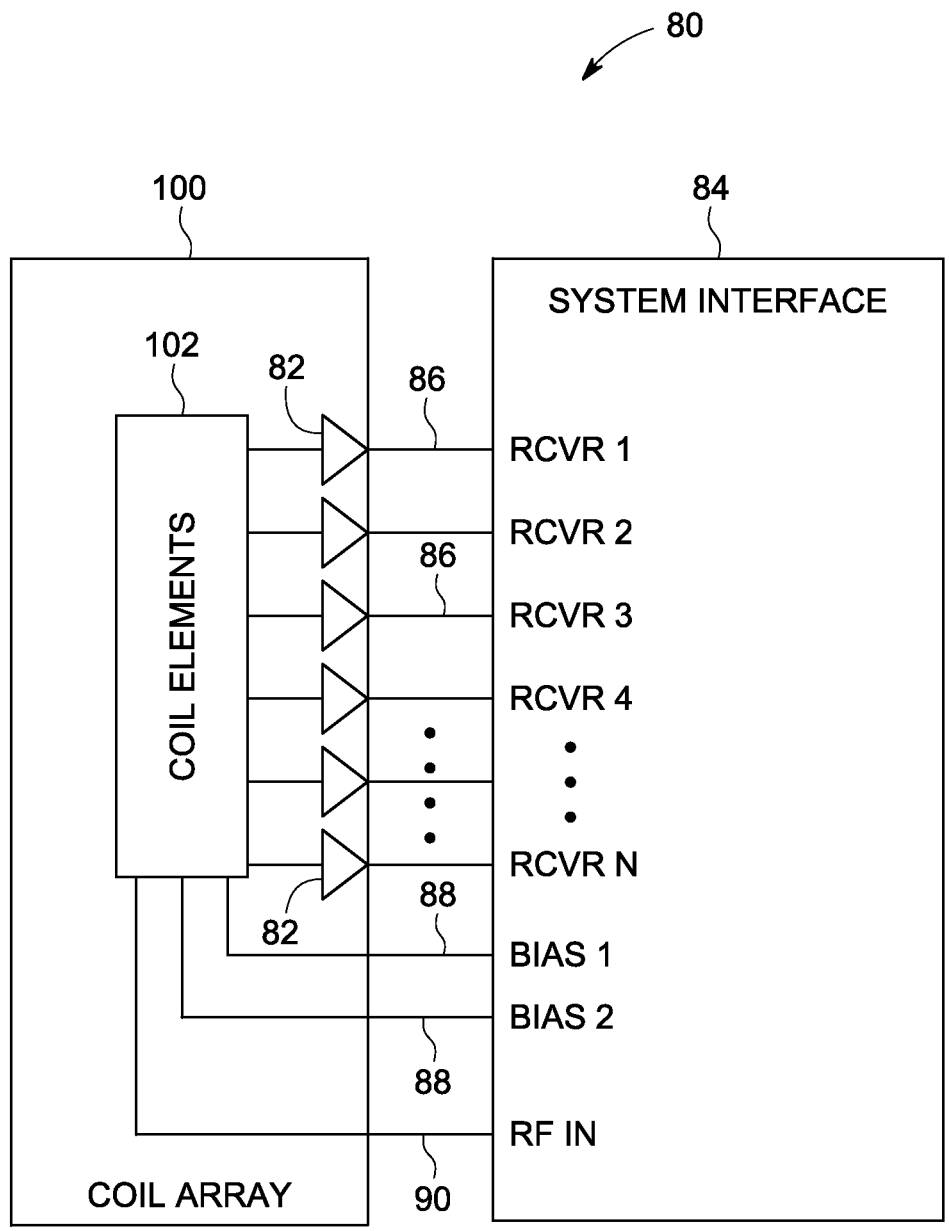
FIG. 1 is a block diagram of a receive section of a magnetic resonance imaging (MRI) system formed in accordance with various embodiments.

The foregoing summary, as well as the following detailed description of certain embodiments, will be better understood when read in conjunction with the appended drawings. To the extent that the figures illustrate diagrams of the functional blocks of various embodiments, the functional blocks are not necessarily indicative of the division between hardware circuitry. Thus, for example, one or more of the functional blocks may be implemented in a single piece of hardware or multiple pieces of hardware. It should be understood that the various embodiments are not limited to the arrangements and instrumentality shown in the drawings.

As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

Various embodiments provide frequency selective negative feedback to preamplifiers of a magnetic resonance imaging (MRI) system. By practicing at least one embodiment, the gain at match split peaks (e.g., gain peaks outside the frequency band clinically relevant for MRI) are suppressed. At least one technical effect of various embodiments includes reducing the possibility for oscillation, while the gain within the signal band remains substantially unaffected. Moreover, in accordance with various embodiments, preamplifier oscillation in multi-channel coil arrays may be reduced or prevented without reducing preamplifier-decoupling performance, and without the use of devices to reduce feedback from the preamplifier into the coil array, such as input baluns, output baluns, additional shielding, additional isolation, etc.

Various embodiments provide feedback, and more particularly, frequency selective negative feedback to preamplifiers in an MRI system. A feedback network providing the negative feedback is configured in at least one embodiment based on different frequency gain peaks outside of a particular frequency band, such as outside of the clinically relevant frequency band used to acquire MR image data.

As illustrated in FIG. 1, various embodiments may be implemented in connection with a receive section 80 of an MRI system. The receive section 80 is configured to acquire MR data using a coil array 100 that includes a plurality of coil elements 102 (illustrated as a single block element in FIG. 1 for simplicity). For example, the coil array 100 may include a plurality of loop elements that form the coil elements 102. It should be noted that the coil elements 102, for example, adjacent loop elements may be overlapped to reduce or minimize coupling. The coil elements 102 are also isolated from each other using preamplifiers 82, for example, low input impedance preamplifiers that also amplify received MR signals from the coil elements 102. It also should be noted that the coil array 100 may be a dedicated receive only coil array or a switchable array, such as a switchable transmit/receive (T/R) phased array coil.

The coil array 100 forms part of a multi-channel receive section 80 connected to an MRI system. The receive section 80 includes a plurality of channels (Rcvr 1 .... Rcvr N), for example, sixteen channels. However, it should be noted that more or less channels may be provided. In the illustrated embodiment, the coil array 100 is connected to the multi-channel receive section 80 having a multi-channel system interface 84 (e.g., a 3T System Interface), with a separate receive channel 86 connected to each one of a plurality of the coil elements 102 (e.g., sixteen channels connected to a four by four coil array). For example, the system interface 84 may form part of a GE 3.0T Excite MRI system.

The system interface 84 also may includes a plurality of bias control lines 88 (illustrated as two lines) to control the switching of decoupling circuits (not shown), which may be controlled, for example, using a coil configuration file stored in the MRI system and/or based on a user input. For example, based on a user input, a particular coil configuration file may be selected to control the coil array 100 configured as a T/R phased array coil in a particular imaging mode (e.g., user control of mode of operation using controls on an MRI scanner). An RF in control line 90 also may be provided in connection with, for example, combiner (not shown) to control a transmit coil array.

Figure 2:
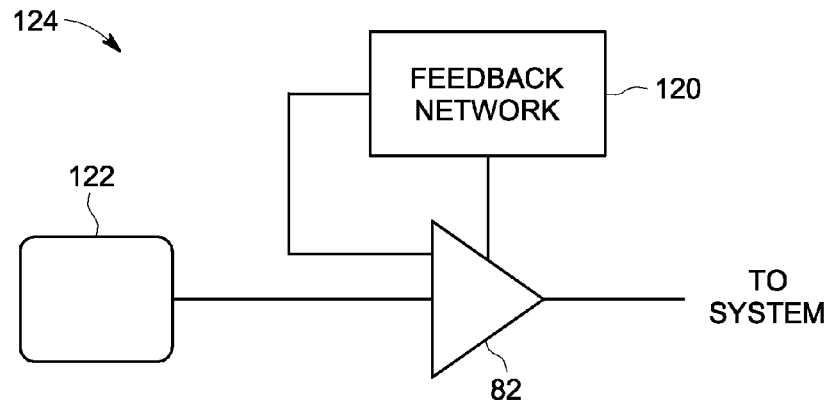
FIG. 2 is a block diagram of one of the preamplifiers of the receive section of FIG. 1 including a feedback network formed in accordance with various embodiments.

One or more of the preamplifiers 82 are configured as on-coil preamplifiers that include a feedback network 120 as illustrated in FIG. 2, which together form a preamplifier arrangement 124. In various embodiments, a separate feedback network 120 is provided for each preamplifier 82. The feedback network 120 may be provided in combination with one or more of the preamplifiers 82 and configured to provide negative feedback. The feedback network 120 may be any type of circuit and include different components that generate feedback to the preamplifier 82. For example, the feedback network 120 may be any type of network configured to generate feedback at one or more predetermined or selected frequencies to reduce gain peaks at different frequencies, namely increased gain at different frequencies of the preamplifier operation. The preamplifier 82 is illustrated in connection with a loop coil 122, but may be implemented in connection with different types and arrangements of coil elements. In various embodiments, the preamplifier 82 is provided on the loop coil 122.

Figure 3:
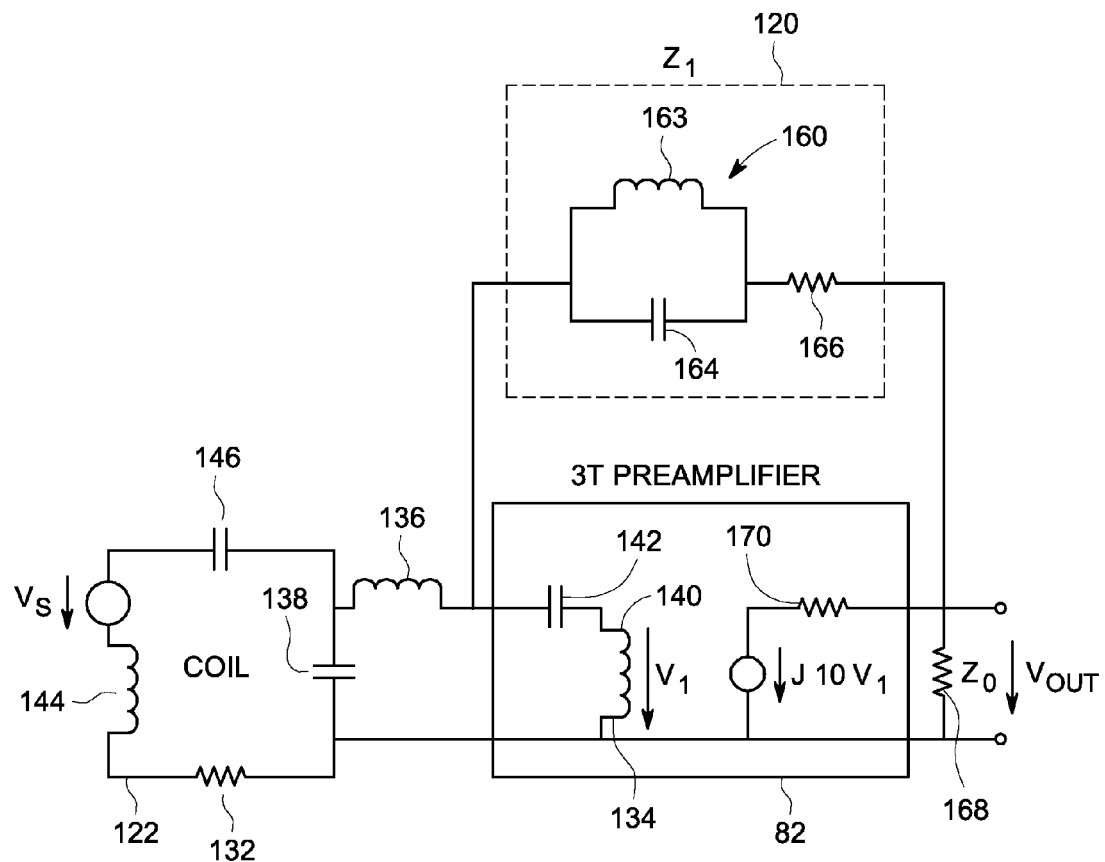
FIG. 3 is a schematic diagram illustrating a feedback network connected to a preamplifier in accordance with an embodiment.

FIG. 3 illustrates an embodiment of a feedback network 120 for the preamplifier 82 of an MRI system. In the illustrated embodiment, the preamplifier 82 is a low impedance preamplifier, for example, a low impedance 3T preamplifier and the loop coil 122 is a surface coil, for example, a three inch surface coil (unloaded). It should be noted that for purposes of illustration, all of the capacitors are considered lossless and the inductors are modeled with a series resistance. For example, the unloaded coil resistance represented by the resistive element 132 may be 0.6 ohms and the preamplifier input impedance represented by the inductive element 134 may be 1.2 ohms at resonance frequency. Additionally, $s_{21}$ is about 28 decibels (dB) with a phase shift of 180 degrees.

Figure 4:
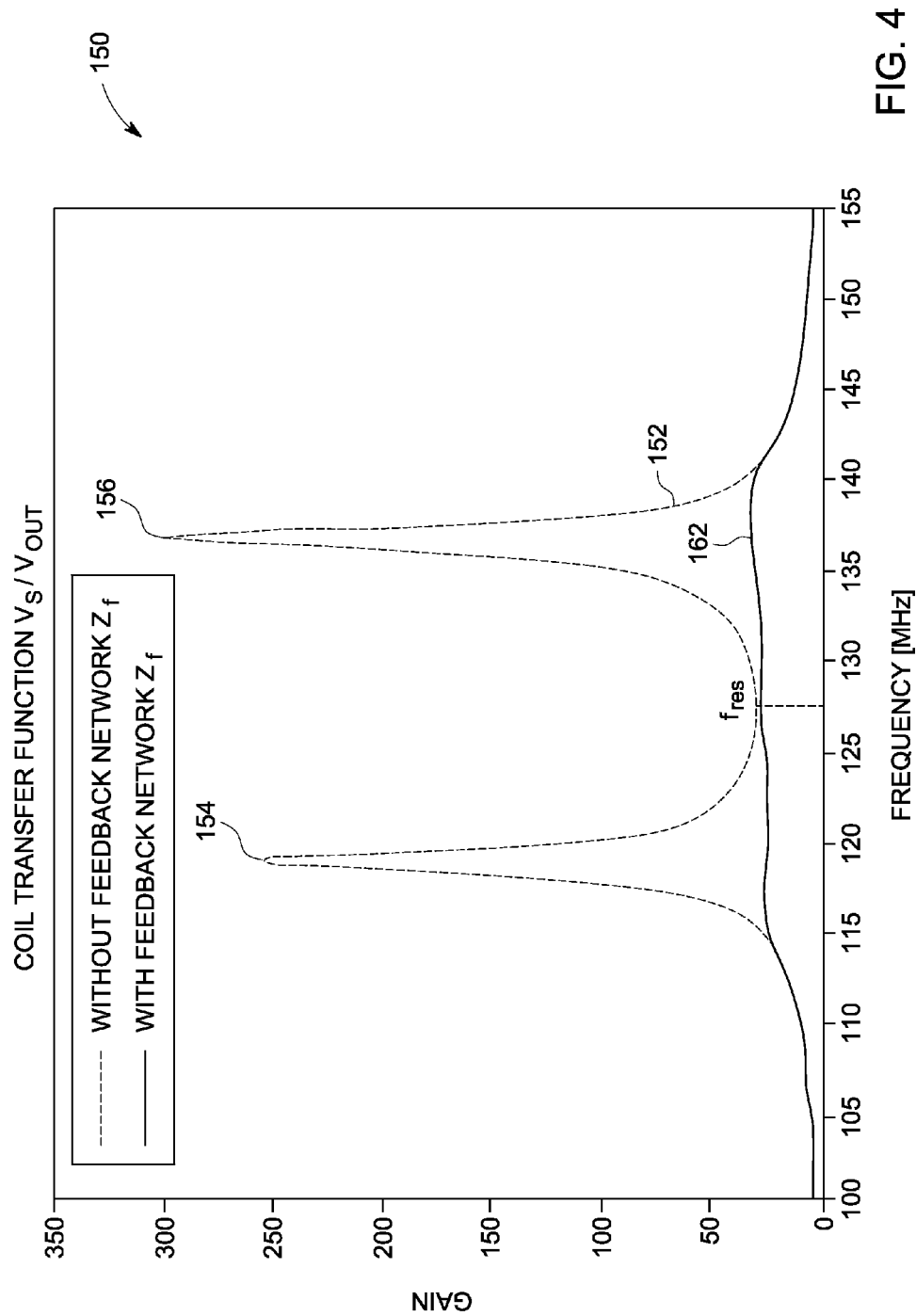
FIG. 4 is a graph showing coil transfer functions.

The coil transfer function $V_{out}/V_s$ is illustrated in the graph 150 of FIG. 4, wherein the horizontal axis represents frequency in Megahertz (MHz) and the vertical axis represents gain. The curve 152 is the transfer function without the feedback network 120 and the curve 162 is the transfer function with the feedback network 120. As can be clearly seen in the graph 150, the transfer function for the coil preamplifier 82 without the feedback network 120 is more likely to oscillate as a result of two coupled oscillators caused by the high gain from the coil 122 and preamplifier 82 at the match split peaks 154 and 156. Referring again to FIG. 3, the coupled oscillators (that operate as resonators) are formed from (i) the inductor 144 and capacitors 146 and 138 and (ii) the inductors 136 and 140 and capacitors 138 and 142, which cause the peak splitting. Thus, the capacitor 138, which is shared by the two resonators, couples the two resonators.

In the illustrated embodiment, as shown in FIG. 4, the peaks 154 and 156 of the curve 152 occur at about 10 MHz above and below resonance frequency, namely at 138 MHz and 118 MHz, which are 10 MHz above and below the resonance frequency of 128 MHz. Oscillation is typically more likely to occur at these peaks 154 and 156 (also referred to herein as oscillation frequencies), particularly as a result of the 180 degree phase shift between the peaks 154 and 156. It should be noted that the low impedance of the preamplifier 82 causes the high gain at the match split peaks 154 and 156.

However, as can be clearly seen by the curve 162, the transfer function for the preamplifier 82 with the feedback network 120, has the peaks 154 and 156 reduced and/or suppressed. Referring again to FIG. 3, the feedback network 120 is represented as $Z_f$ and in the illustrated embodiment is a parallel resonator 160 tuned to the resonance frequency to thereby apply frequency selective negative feedback to suppress the gain at the matched split peaks 154 and 156 (shown in FIG. 4). More particularly, the parallel resonator 160 includes an inductor 163 in parallel connection with a capacitor 164. For example, and continuing with the example above, the inductor 163 may be a chip inductor, such as an 82 nano-Henry (nH) chip inductor (with a Q-factor of about 50) in parallel with a 19 pico-Farad (pF) ceramic chip capacitor that provides about 3 kilo-Ohms of peak resistance. The parallel resonator 160 is connected between an input and output of the preamplifier 82 and creates little feedback within the signal band and has a small affect on the noise figure, for example, about 0.05 dB.

Thus, in the described example, the parallel resonator 160 includes the inductor 163 and capacitor 164 configured to form a resonator that resonates at about 128 MHz, for example, a resonator with about a 3 kilo-Ohm peak resistance. The selected values also drive the parallel resonator 160 such that inductive feedback results at about 118 MHz and capacitive feedback results at about 138 MHz. It should be noted that feedback also can occur at other frequencies. Accordingly, the parallel resonator 160 resonates such that feedback is provided to suppress the matched split peaks 154 and 156 at 118 MHz and 138 MHz.

In various embodiments, the parallel resonator 160 is configured to suppress gain peaks at frequencies outside of the clinically relevant range, for example, at a determined frequency above and/or below resonance frequency. For example, negative feedback in the described example is generated at 10 MHz above and below the resonance frequency. In some embodiments, the feedback is generated at a certain decibel (dB) level, for example, 3 dB.

It should be noted that a resistor 166 optionally may be connected at the output of the parallel resonator 160, namely in series with the parallel resonator 160, for example, if needed to prevent oscillation at higher frequencies. It should be noted that in some preamplifier arrangements the resistor 166 is not included. The resistor 166 is illustrated as having a 200 Ohm resistance in this example. In some embodiments, a T-network, represented by the impedance ($Z_0$) 168 may be added to the output ($V_{out}$) of the preamplifier 82 such that the $s_{21}$ of the preamplifier 82 in the receive section 80 (shown in FIG. 1) have a total phase shift of 180 degrees. It also should be noted that the resistor 170 at the output of the preamplifier 82 represents the output impedance of the preamplifier 82.

It should be noted that depending on the dynamic disabling, oscillation during transmit operation of the MRI also may need to be suppressed or prevented, for example, using a pin-diode (not shown) provided in parallel with the feeding capacitor of the coil 122.

Accordingly, various embodiments can provide a multi-channel (e.g., sixteen channel) coil having frequency selective negative feedback wherein the preamplifier has a low input impedance (e.g., an impedance between 0.8 Ohms and 1.2 Ohms) and without the use of baluns or other oscillation suppression devices. Thus, by practicing various embodiments lower input impedances may be provided without driving the system into instability. Thus, system oscillation is mitigated or suppressed while providing low input preamplifier impedance.

Figure 5:
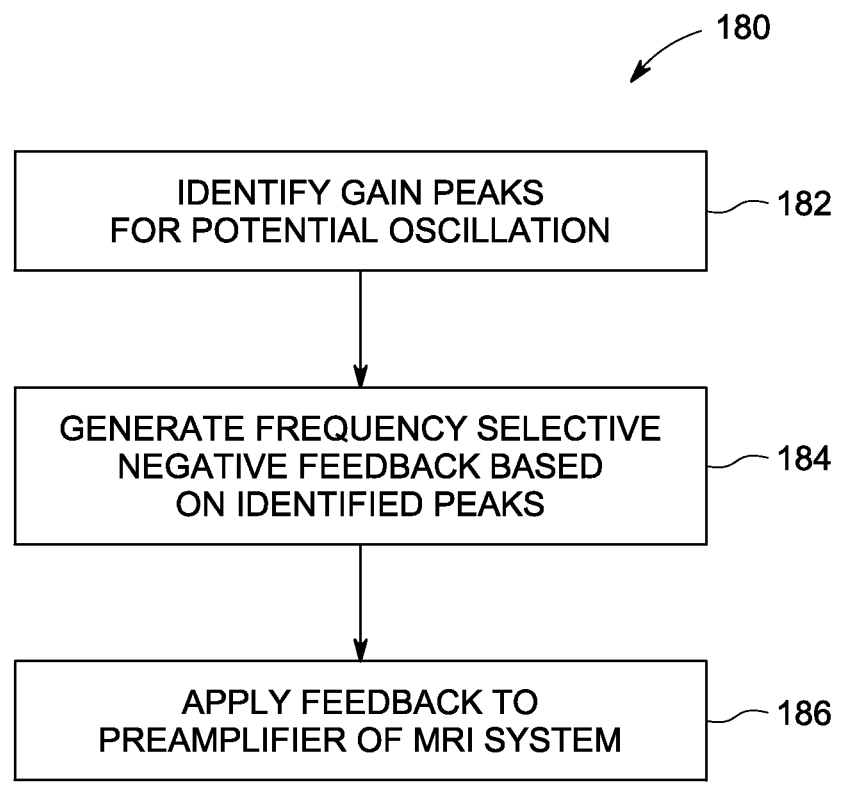
FIG. 5 is a flowchart of a method in accordance with an embodiment for mitigation or suppression of oscillation in an MRI system.

The mitigation or suppression of oscillation may be provided using a method 180 as shown in FIG. 5. The method includes identifying gain peaks at 182 that may cause or result in oscillation. For example, a coil transfer function for a coil array, such as a multi-channel coil array, may be used to identify gain peaks, which may be matched split peaks as described in more detail herein. The gain peaks may be at frequencies where the signal gain is substantially higher than the normal operating gain. It should be noted that in various embodiments the peaks are located outside of the clinically relevant frequencies for a particular MRI imaging scan.

Thereafter, frequency selective feedback, which in various embodiments is frequency selective negative feedback, is generated at 184 based on the identified peaks. The frequency selective feedback is generated, for example, by a parallel resonator. However, other networks or means may be used to generate the frequency selective feedback, such as any type of feedback loop that provides negative feedback. The frequency of the feedback signal is configured using the components of the feedback means, such as the parallel resonator. For example, the components that generate the feedback signal and the value of the components are selected or varied such that the feedback is generated at the identified peaks.

The feedback is then applied at 186, for example, applied to one or more preamplifiers of an MRI system as described in more detail herein. Each preamplifier in various embodiments is provided with a separate feedback loop.

It should be noted that the various embodiments are not limited to a particular MRI system or a particular coil type or arrangement. Accordingly, the feedback network may be used with an MRI system having different power levels, channels, etc. and that have different receive surface coils operating at one or more frequencies. Moreover, the components included within the feedback network and the value of each of the components may be varied as desired or needed. For example, the values of the components forming the feedback network or other portions of the system may be selected based on the frequency peaks to be suppressed.

Figure 6:
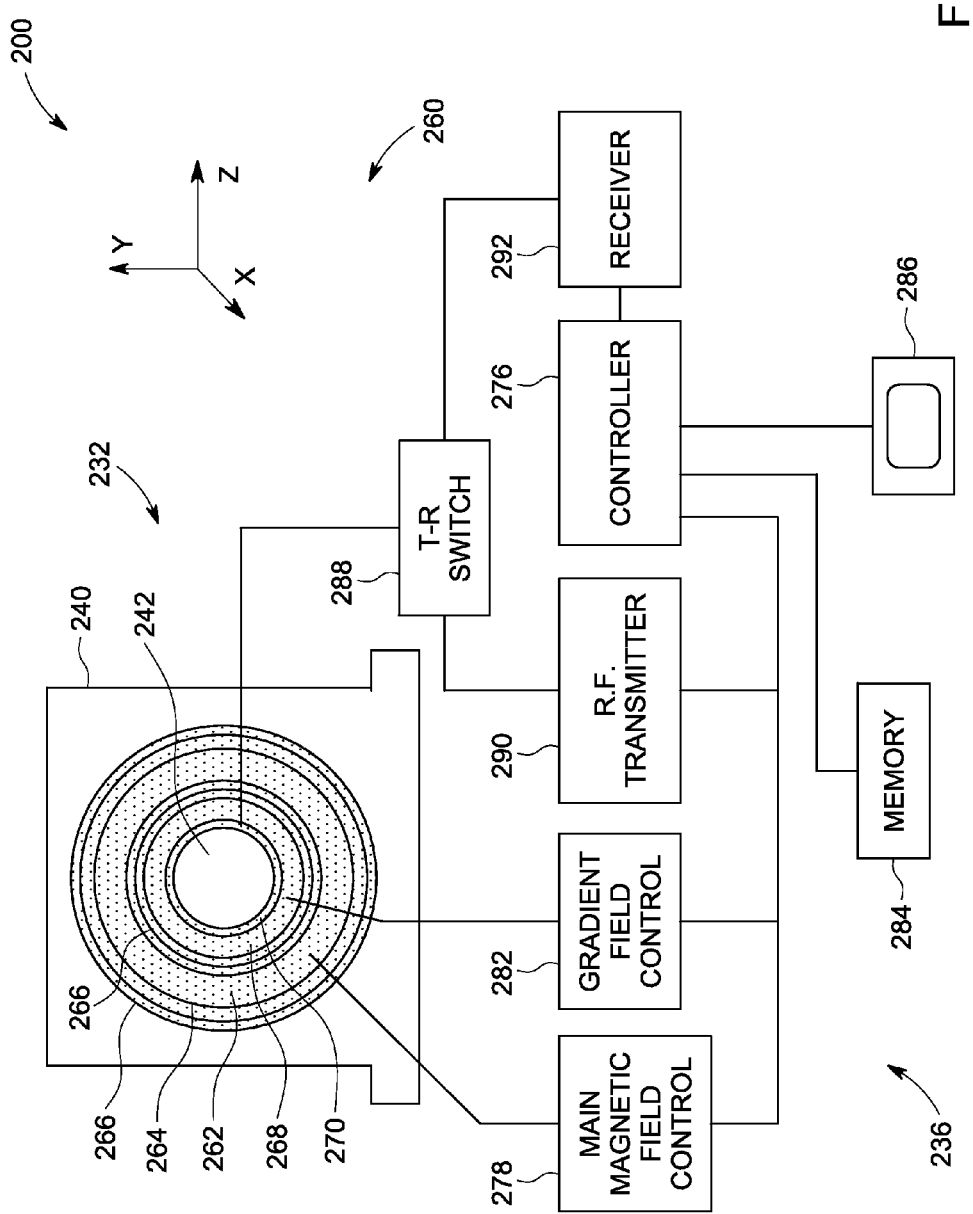
FIG. 6 is a pictorial view of an MRI system in which preamplifiers with feedback networks formed in accordance with various embodiments may be implemented.

The various embodiments may be implemented, for example, with MR coils for use with the MRI system 200 shown in FIG. 6. It should be appreciated that although the imaging system 200 is illustrated as a single modality imaging system, the various embodiments may be implemented in or with multi-modality imaging systems. The imaging system 200 is illustrated as an MRI imaging system and may be combined with different types of medical imaging systems, such as a Computed Tomography (CT), Positron Emission Tomography (PET), a Single Photon Emission Computed Tomography (SPECT), as well as an ultrasound system, or any other system capable of generating images, particularly of a human. Moreover, the various embodiments are not limited to medical imaging systems for imaging human subjects, but may include veterinary or non-medical systems for imaging non-human objects, luggage, etc.

Referring to FIG. 6, the MRI system 200 generally includes an imaging portion 232 and a processing portion 236 that may include a processor or other computing or controller device. The MRI system 200 includes within a gantry 240 a superconducting magnet 262 formed from magnetic coils supported on a magnet coil support structure. However, in other embodiments, different types of magnets may be used, such as permanent magnets or electromagnets. A vessel 264 (also referred to as a cryostat) surrounds the superconducting magnet 262 and is filled with liquid helium to cool the coils of the superconducting magnet 262. Thermal insulation 266 is provided surrounding the outer surface of the vessel 264 and the inner surface of the superconducting magnet 262. A plurality of magnetic gradient coils 268 are provided within the superconducting magnet 262 and an RF transmit coil 270 is provided within the plurality of magnetic gradient coils 268. In some embodiments the RF transmit coil 270 may be replaced with a transmit and receive coil as described in more detail herein. The components within the gantry 240 generally form the imaging portion 232. It should be noted that although the superconducting magnet 262 is a cylindrical shaped, other shapes of magnets can be used.

The processing portion 236 generally includes a controller 256, a main magnetic field control 278, a gradient field control 282, a memory 284, a display device 286, a transmit-receive (T-R) switch 288, an RF transmitter 290 and a receiver 292.

In operation, a body of an object, such as a patient or a phantom to be imaged, is placed in the bore 242 on a suitable support, for example, a patient table. The superconducting magnet 262 produces a uniform and static main magnetic field $B_o$ across the bore 242. The strength of the electromagnetic field in the bore 242 and correspondingly in the patient, is controlled by the controller 276 via the main magnetic field control 278, which also controls a supply of energizing current to the superconducting magnet 262.

The magnetic gradient coils 268, which include one or more gradient coil elements, are provided so that a magnetic gradient can be imposed on the magnetic field $B_o$ in the bore 242 within the superconducting magnet 262 in any one or more of three orthogonal directions x, y, and z. The magnetic gradient coils 268 are energized by the gradient field control 282 and are also controlled by the controller 276.

The RF transmit coil 270, which may include a plurality of coils, is arranged to transmit magnetic pulses and/or optionally simultaneously detect MR signals from the patient if receive coil elements are also provided, such as a surface coil configured as an RF receive coil. The RF receive coil may be of any type or configuration, for example, a separate receive surface coil and include preamplifiers with a feedback network as described in more detail herein. Moreover the system interface 84 (shown in FIG. 1) may form part of, for example, the controller 276, T-R switch 288 or receiver 292, which with the coil array may form the receive section 80.

The RF transmit coil 270 may be a body coil, such as a birdcage type coil. The receive surface coil may be an array of RF coils provided within the RF transmit coil 270. The RF transmit coil 270 is detuned or decoupled from the receive surface coil(s) as described herein. Thus, the RF transmit coil 270 configured as a body part specific coil (e.g., torso coil), may be combined with the receive surface coil.

The RF transmit coil 270 and the receive surface coil are selectably interconnected to one of the RF transmitter 290 or receiver 292, respectively, by the T-R switch 288. The RF transmitter 290 and T-R switch 288 are controlled by the controller 276 such that RF field pulses or signals are generated by the RF transmitter 290 and selectively applied to the patient for excitation of magnetic resonance in the patient. While the RF excitation pulses are being applied to the patient, the T-R switch 288 is also actuated to disconnect the receive surface coil from the receiver 292.

Following application of the RF pulses, the T-R switch 288 is again actuated to disconnect the RF transmit coil 270 from the RF transmitter 290 and to connect the receive surface coil to the receiver 292. The receive surface coil operates to detect or sense the MR signals resulting from the excited nuclei in the patient and communicates the MR signals to the receiver 292, which may be communicated to multiple channels as described in more detail herein. These detected MR signals are in turn communicated to the controller 276. The controller 276 includes a processor (e.g., image reconstruction processor), for example, that controls the processing of the MR signals to produce signals representative of an image of the patient.

The processed signals representative of the image are also transmitted to the display device 286 to provide a visual display of the image. Specifically, the MR signals fill or form a k-space that is Fourier transformed to obtain a viewable image. The processed signals representative of the image are then transmitted to the display device 186.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from their scope. While the dimensions and types of materials described herein are intended to define the parameters of the various embodiments, they are by no means limiting and are merely exemplary. Many other embodiments will be apparent to those of skill in the art upon reviewing the above description. The scope of the various embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose the various embodiments, including the best mode, and also to enable any person skilled in the art to practice the various embodiments, including making and using any devices or systems and performing any incorporated methods. The patentable scope of the various embodiments is defined by the claims, and may include other examples that occur to those skilled in the art. Such other examples are intended to be within the scope of the claims if the examples have structural elements that do not differ from the literal language of the claims, or the examples include equivalent structural elements with insubstantial differences from the literal languages of the claims.

What is claimed is:

1. A preamplifier arrangement for a magnetic resonance imaging (MRI) system, the preamplifier arrangement comprising:
    a plurality of preamplifiers, each of the preamplifiers connected to a different coil of a multi-channel coil array of the MRI system, wherein the preamplifiers are configured as on-coil preamplifiers coupled to the multi-channel coil array, and wherein each preamplifier and corresponding coil couple to form a set of oscillators, the oscillators having resonant frequencies at matched split peaks; and
    a plurality of feedback networks, each feedback network comprising a parallel resonator, the parallel resonator being connected between an input and an output of a corresponding preamplifier, each of the feedback networks configured to generate negative feedback at the matched split peaks to suppress gain at frequencies of the matched split peaks, the negative feedback outside a clinically relevant frequency range of the MRI system.

2. A preamplifier arrangement in accordance with claim 1 further comprising a series connected resistor at an output of the parallel resonator.

3. A preamplifier arrangement in accordance with claim 1 wherein the feedback network is configured to generate feedback at ten megahertz above and below a resonance frequency of the multi-channel coil array.

4. A preamplifier arrangement in accordance with claim 1 wherein the feedback network is configured to generate feedback at three decibels from a resonance frequency of the multi-channel coil array.

5. A preamplifier arrangement in accordance with claim 1 wherein the preamplifier has an impedance of between about 0.8 Ohms and about 1.2 Ohms.

6. A receive section for a magnetic resonance imaging (MRI) system, the receive section comprising:
    a plurality of channels connected to a receive coil array;
    a plurality of preamplifiers, each preamplifier connected to a corresponding one of the channels, the preamplifiers configured as on-coil preamplifiers coupled to the receive coil array, the coupling of each preamplifier to a corresponding coil of the receive coil array forming a set of coupled oscillators having resonant frequencies at matched split peaks; and a plurality of feedback networks, each feedback network connected between an input and an output of a corresponding preamplifier, the feedback networks each including a parallel resonator configured to provide selective negative feedback to the corresponding preamplifier, the feedback networks generating the selective negative feedback at the matched split peaks to suppress gain at frequencies of the matched split peaks, the negative feedback outside a clinically relevant frequency range of the MRI system.

7. A receive section in accordance with claim 6 wherein the parallel resonator is configured to generate feedback at split matched frequency peaks above and below a resonance frequency of the receive coil array.

8. A receive section in accordance with claim 6 wherein the preamplifiers have an impedance of between approximately 0.8 Ohms and approximately 1.2 Ohms.

9. A receive section in accordance with claim 6 wherein the preamplifiers comprise preamplifiers for a 3 Tesla MRI system.

10. A receive section in accordance with claim 6 wherein at least one of the feedback networks comprises a serially connected resistor at an output.

11. A receive section in accordance with claim 6 wherein the feedback networks are configured to generate the feedback without baluns.

12. A receive section in accordance with claim 6 wherein the feedback networks are configured to generate the feedback without additional oscillation suppression devices, the oscillations not resulting from crosstalk between a plurality of coils of the receive coil array.

13. A receive section in accordance with claim 6 wherein the preamplifiers are configured having a total phase shift of 180 degrees.

14. A receive section in accordance with claim 6 wherein the feedback networks are tuned at a resonance frequency of the receive coil array, the receive coil array comprising a plurality Of coil elements, wherein at least two adjacent coil elements are overlapped.

15. A method for suppressing oscillation in a multi-channel coil array of a magnetic resonance imaging (MRI) system, the method comprising:
receiving, at a plurality of preamplifiers of the MRI system, magnetic resonance signals from a corresponding plurality of coils of a multi-channel coil array of the MRI system, each of the preamplifiers configured as on-coil preamplifiers coupled to the multi-channel coil array and connected to a corresponding one of the coils, wherein each preamplifier and corresponding coil couple to form a set of oscillators, the oscillators having resonant frequencies at matched split peaks; and
generating frequency selective negative feedback with a plurality of feedback networks, each feedback network comprising a parallel resonator, the parallel resonator being connected between an input and an output of a corresponding preamplifier, each of the feedback networks configured to generate negative feedback at the matched split peaks to suppress gain at frequencies of the matched split peaks, the negative feedback outside a clinically relevant frequency range.

16. A method in accordance with claim 15 further comprising suppressing preamplifier oscillation without using additional oscillation suppression devices.

* * * * *